(12) United States Patent
Oh et al.

(10) Patent No.: US 10,096,632 B2
(45) Date of Patent: Oct. 9, 2018

(54) IMAGE SENSOR

(71) Applicant: SAMSUNG ELECTRONICS CO., LTD., Suwon-si, Gyeonggi-Do (KR)

(72) Inventors: Young Sun Oh, Yongin-si (KR); Yi Tae Kim, Hwaseong-si (KR); Jung Chak Ahn, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 3 days.

(21) Appl. No.: 15/425,570

(22) Filed: Feb. 6, 2017

(65) Prior Publication Data

US 2017/0236858 A1  Aug. 17, 2017

(30) Foreign Application Priority Data

Feb. 11, 2016 (KR) .................. 10-2016-0015779

(51) Int. Cl.
*H01L 27/14* (2006.01)
*H01L 27/146* (2006.01)

(52) U.S. Cl.
CPC .... *H01L 27/14612* (2013.01); *H01L 27/1462* (2013.01); *H01L 27/1463* (2013.01); *H01L 27/14627* (2013.01); *H01L 27/14636* (2013.01); *H01L 27/14643* (2013.01)

(58) Field of Classification Search
CPC ... H01L 27/14; H01L 27/146; H01L 27/1461; H01L 27/1462; H01L 27/14612; H01L 27/14627; H01L 27/1463; H01L 27/1464; H01L 27/14636; H01L 27/14643

USPC ........................................ 257/292
See application file for complete search history.

(56) References Cited

U.S. PATENT DOCUMENTS

| | | | |
|---|---|---|---|
| 7,417,273 B2 | 8/2008 | Inoue et al. | |
| 7,477,299 B2 | 1/2009 | Higuchi et al. | |
| 8,106,984 B2 | 1/2012 | Takeuchi et al. | |
| 8,390,089 B2 | 3/2013 | Chen et al. | |
| 9,136,298 B2 | 9/2015 | Lin et al. | |
| 2006/0175538 A1 | 8/2006 | Kim et al. | |
| 2013/0307040 A1* | 11/2013 | Ahn | H01L 27/1463 257/292 |
| 2014/0246707 A1 | 9/2014 | Koo et al. | |
| 2014/0293106 A1* | 10/2014 | Park | H03K 5/08 348/308 |
| 2014/0362272 A1 | 12/2014 | Ahn et al. | |

(Continued)

FOREIGN PATENT DOCUMENTS

| | | |
|---|---|---|
| JP | 2009-177542 | 8/2009 |
| KR | 2014-0142966 A | 12/2014 |

*Primary Examiner* — Monica D Harrison
(74) *Attorney, Agent, or Firm* — Volentine, Whitt & Francos, PLLC

(57) ABSTRACT

An image sensor includes a substrate having a first pixel region and a second pixel region adjacent to the first pixel region, a device isolation layer between the first pixel region and the second pixel region and isolating the first pixel region and the second pixel region from each other, a first transistor disposed in the first pixel region, a second transistor disposed in the second pixel region, and a wiring structure electrically connecting the first transistor and the second transistor. The device isolation layer has a deep trench isolation (DTI) structure which extends from a top surface toward a bottom surface of the substrate.

20 Claims, 21 Drawing Sheets

(56) References Cited

U.S. PATENT DOCUMENTS

2015/0236058 A1 8/2015 Hu et al.
2016/0172394 A1* 6/2016 Lee .................. H01L 27/14607
                                                              257/432

* cited by examiner

IMAGE SENSOR

CROSS-REFERENCE TO RELATED APPLICATION

A claim for priority under 35 U.S.C. § 119 is made to Korean Patent Application No. 10-2016-0015779 filed on Feb. 11, 2016 in the Korean Intellectual Property Office, the disclosure of which is incorporated herein in its entirety by reference.

BACKGROUND

The inventive concepts described herein relate to an image sensor.

An image sensor is a semiconductor device that converts an optical image into an electrical signal. An image sensor reads image information by converting charge generated in a pixel responsive to light into a voltage signal. Image sensors can be generally classified as charge-coupled device (CCD) image sensors or complementary metal oxide semiconductor (CMOS) image sensors.

With recent developments in computer and communication industries, CMOS image sensors are becoming widely used in various electronic devices such as digital cameras, camcorders, game consoles, security cameras, medical micro-cameras, robots and the like. As the integration density of CMOS image sensors has increased and the size of CMOS image sensors has decreased, the size of pixels (which are read units of image information) has gradually decreased.

Each of the unit pixels of a CMOS image sensor includes a photoelectric conversion unit and a charge transfer unit. The charge transfer unit transmits charge generated at the photoelectric conversion unit from incident light to a charge detection unit. CMOS image sensors typically include an active pixel area and an optical black area. The active pixel area is an area that receives incident light and converts the incident light into an electrical signal. The optical black area is an area that blocks transmission of light so as to provide the basis for a black signal of the active pixel area.

SUMMARY

Embodiments of the inventive concept provide an image sensor having a deep trench isolation (DTI) structure and having improved noise properties obtained by increasing the area of source follower transistors in each pixel.

Embodiments of the inventive concept provide an image sensor including a substrate including a first pixel region and a second pixel region adjacent to the first pixel region; a device isolation layer between the first pixel region and the second pixel region, and configured to isolate the first pixel region and the second pixel region from each other; a first transistor disposed in the first pixel region; a second transistor disposed in the second pixel region; and a wiring structure configured to electrically connect the first transistor and the second transistor. The device isolation layer has a deep trench isolation (DTI) structure that extends from a top surface of the substrate toward a bottom surface of the substrate.

Embodiments of the inventive concept provide an image sensor including a substrate including first through fourth pixel regions; a device isolation layer between the first, second, third and fourth pixel regions, and configured to isolate the first through fourth pixel regions from each another; a first drive transistor disposed in the first pixel region; a second drive transistor disposed in the second pixel region; a reset transistor disposed in the third pixel region; a select transistor disposed in the fourth pixel region; and a wiring structure configured to electrically connect the first drive transistor and the second drive transistor.

Embodiment of the inventive concept also provide an image sensor including first through fourth transfer transistors; a first photoelectric conversion device connected to a source node of the first transfer transistor; a second photoelectric conversion device connected to a source node of the second transfer transistor; a third photoelectric conversion device connected to a source node of the third transfer transistor; a fourth photoelectric conversion device connected to a source node of the fourth transfer transistor; a first drive transistor connected to a drain node of the first transfer transistor, a drain node of the second transfer transistor, a drain node of the third transfer transistor, and a drain node of the fourth transfer transistor; and a second drive transistor connected to the drain node of the first transfer transistor, the drain node of the second transfer transistor, the drain node of the third transfer transistor, and the drain node of the fourth transfer transistor.

BRIEF DESCRIPTION OF THE DRAWINGS

Embodiments of the inventive concept will be more clearly understood from the following detailed description taken in conjunction with the accompanying figures, and wherein like reference numerals refer to like parts throughout the various figures unless s otherwise specified.

DETAILED DESCRIPTION

The present disclosure will now be described more fully hereinafter with reference to the accompanying drawings, in which example embodiments of the disclosure are shown. This disclosure may, however, be embodied in different forms and should not be construed as limited to the embodiments set forth herein.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
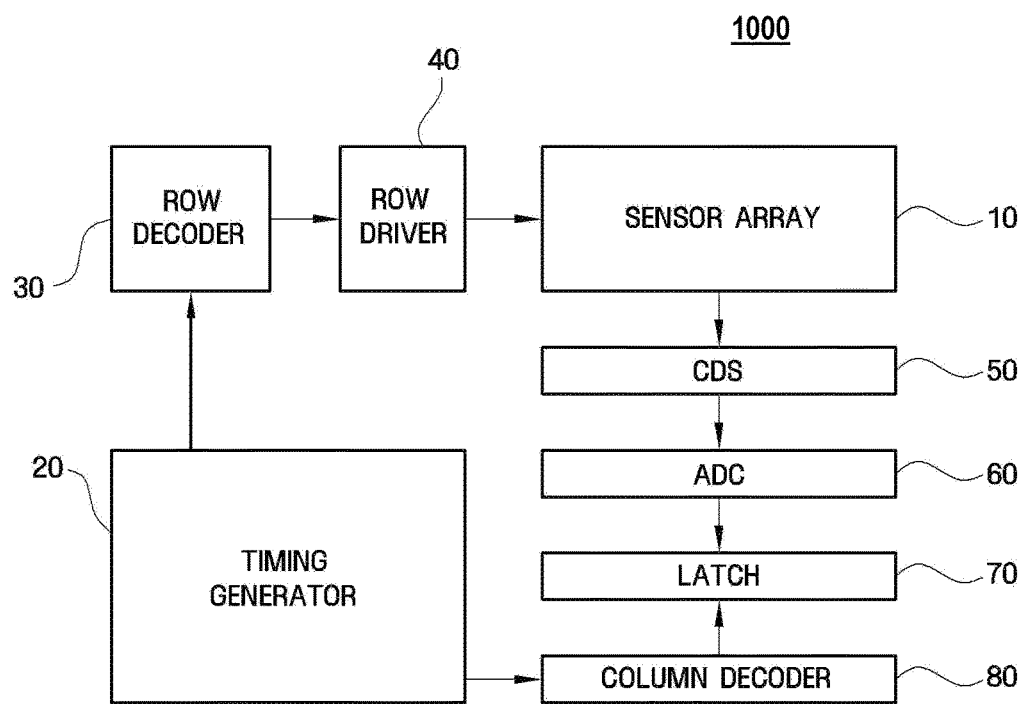
FIG. 1 illustrates a block diagram of an image sensor according to an embodiment of the inventive concept.
Figure 2:
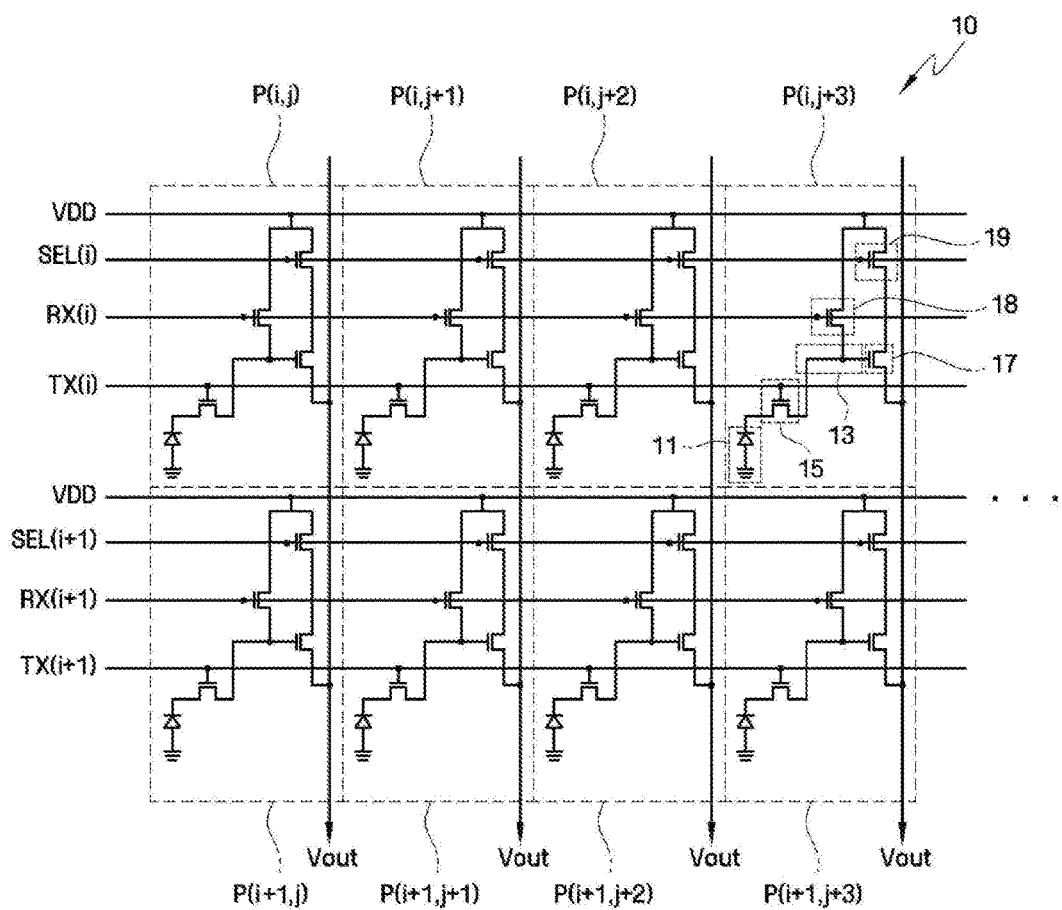
FIG. 2 illustrates an equivalent circuit diagram of a sensor array of FIG. 1.
Figure 3:
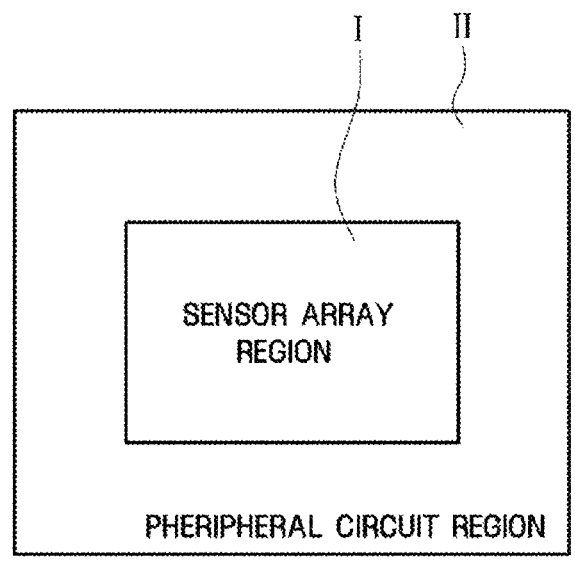
FIG. 3 illustrates a conceptual view for explaining the image sensor of FIG. 1.

FIG. 1 illustrates a block diagram of an image sensor according to an embodiment of the inventive concepts. FIG. 2 illustrates an equivalent circuit diagram of a sensor array of FIG. 1. FIG. 3 illustrates a conceptual view for explaining the image sensor of FIG. 1.

Referring to FIG. 1, an image sensor 1000 includes a sensor array 10 in which a plurality of pixels each having a photoelectric conversion device are arranged two-dimensionally, a timing generator 20, a row decoder 30, a row driver 40, a correlated double sampler (CDS) 50, an analog-to-digital converter (ADC) 60, a latch 70, and a column decoder 80.

The sensor array 10 includes a plurality of unit pixels which are arranged two-dimensionally. The unit pixels convert light from an optical image into an electrical output signal. The sensor array 10 receives various driving signals such as a row select signal, a reset signal, and a charge transfer signal from the row driver 40. The unit pixels are driven responsive to the various driving signals. The electrical output signals of the sensor array 10 are provided to the CDS 50 via signal lines.

The timing generator 20 provides a timing signal and a control signal to the row decoder 30 and the column decoder 80.

The row driver 40 provides the sensor array 10 with a plurality of driving signals for driving the unit pixels according to decoding results provided by the row decoder 30. In general, in a case in which the unit pixels are arranged in rows and columns in a matrix form, the row driver 40 provides driving signals to the unit pixels in units of rows.

The CDS 50 receives the output signals provided by the sensor array 10 via vertical signal lines, and holds and samples the received output signals. That is, the CDS 50 samples both a particular noise level and a signal level of a received output signal, and outputs a differential level which corresponds to the difference between the noise level and the signal level.

The ADC 60 converts analog signals corresponding to the differential levels output by the CDS 50 into digital signals, and outputs the digital signals.

The latch 70 latches the digital signals, and the latched signals are sequentially output to an image signal processor (not illustrated) according to the decoding results provided by the row decoder 30.

Referring to FIG. 2, unit pixels P are arranged in a matrix form so as to form the sensor array 10. Each of the unit pixels P includes a photoelectric conversion device 11, a floating diffusion region 13, a charge transfer device 15, a drive device 17, a reset device 18, and a select device 19. The functions of the photoelectric conversion device 11, the floating diffusion region 13, the charge transfer device 15, the drive device 17, the reset device 18, and the select device 19 will hereinafter be described with reference to an exemplary i-th row of unit pixels P(i, j), P(i, j+1), P(i, j+2), P(i, j+3), . . . .

The photoelectric conversion device 11 absorbs incident light and accumulates charge corresponding to the intensity of the incident light. The photoelectric conversion device 11 may be for example a photodiode, a phototransistor, a photogate, a pinned photodiode, or a combination thereof, but is not limited thereto. FIG. 2 illustrates a photodiode as an example of the photoelectric conversion device 11.

The photoelectric conversion device 11 is coupled to the charge transfer device 15 which may be turned on by a bias (i.e., a charge transfer signal) provided by a transfer line TX(i) to transmit the accumulated charge from the photoelectric conversion device 11 to the floating diffusion region 13. The floating diffusion region 13, which converts charge into a voltage, has parasitic capacitance, and thus charge is cumulatively stored in the floating diffusion region 13.

The drive device 17, which is illustrated in FIG. 2 as being a source follower amplifier, amplifies a change in the electric potential of the floating diffusion region 13 which receives the accumulated charge from the photoelectric conversion device 11, and outputs the result of the amplification to an output line Vout.

The reset device 18 periodically resets the floating diffusion region 13. The reset device 18 may consist of a metal oxide semiconductor (MOS) transistor, which is driven by a bias (i.e., a reset signal) provided by a reset line RX(i). If the reset device 18 is turned on by the bias provided by the reset line RX(i), a predetermined electric potential provided to the drain of the reset device 18, for example a power supply voltage VDD, may be transmitted to the floating diffusion region 13.

The select device 19 selects a row of unit pixels P to be read. The select device 19 may consist of a MOS transistor, which is driven by a bias (i.e., a row select signal) provided by a row select line SEL(i). If the select device 19 is turned on by the bias provided by the row select line SEL(i), a predetermined electric potential provided to the drain of the select device 19, for example the power supply voltage VDD, may be transmitted to the drain of the drive device 17.

A transfer line TX(i) which applies the bias to the charge transfer device 15, the reset line RX(i) which applies the bias to the reset device 18, and the row select line SEL(i) which applies the bias to the select device 19, may extend in a row direction substantially in parallel to one another.

As further shown in FIG. 2, row select line SEL(i+1), reset line RX(i+1) and transfer line TX(i+1) are provided as connected to the (i+1)-th row of unit pixels P(i+1, j), P(i+1, j+1), P(i+1, j+2), P(i+1, j+3), . . . similarly as described above. Since configuration and operation of the (i+1)-th row of unit pixels is similar to the above description of the i-th row of unit pixels, further description of the (i+1)-th row of unit pixels and operation thereof is omitted.

Referring to FIG. 3, a peripheral circuit region II may be, for example, a region in which the CDS 50, the ADC 60, and the latch 70 of FIG. 1 are formed. A sensor array region I may be, for example, a region in which the sensor array 10 of FIG. 1 is formed. The peripheral circuit region II may be formed to surround the sensor array region I, but is not limited thereto.

FIGS. 4 through 8 illustrate circuit diagrams of examples of a unit pixel of the sensor array of FIG. 2.

Figure 4:
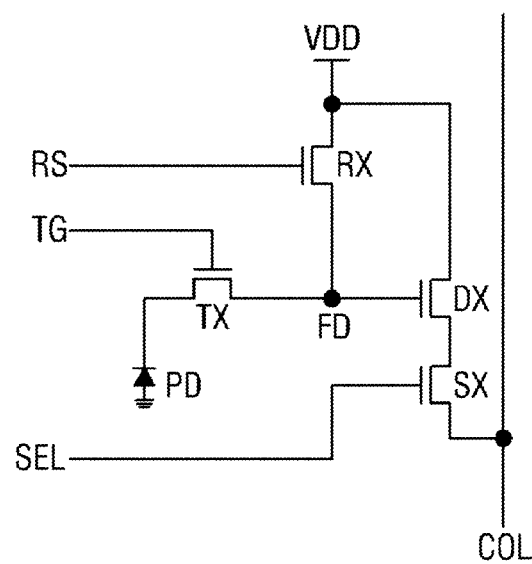
FIGS. 4, 5, 6, 7 and 8 illustrate circuit diagrams of examples of a unit pixel of the sensor array of FIG. 2.

Referring to FIG. 4, a unit pixel P includes a photodiode PD, a transfer transistor TX, a floating diffusion node FD, a reset transistor RX, a drive transistor DX, and a select transistor SX.

The photodiode PD is an exemplary photoelectric conversion device, and may be at least one of a phototransistor, a photogate, a pinned photodiode, and a combination thereof.

FIG. 4 illustrates a four-transistor (4T) unit pixel P consisting of one photodiode PD and four MOS transistors, i.e., the transfer transistor TX, the reset transistor RX, the drive transistor DX, and the select transistor SX, but is not limited thereto. That is, the present disclosure is also applicable to any circuit consisting of a photodiode PD and at least three transistors including the drive transistor DX and the select transistor SX.

The operation of the unit pixel P of FIG. 4 will hereinafter be described. The photodiode PD generates photocharge that is variable depending on the intensity of incident light from a target object. The transfer transistor TX transmits the photocharge to the floating diffusion node FD according to a transfer control signal TG output by the row driver 40.

The drive transistor DX amplifies the photocharge and transmits the amplified photocharge to the select transistor SX according to an electric potential corresponding to photocharge accumulated in the floating diffusion node FD.

The drain node of the select transistor SX is connected to the source node of the drive transistor DX, and the select transistor SX outputs a pixel signal to a column line COL to which the unit pixel P is connected, according to a select signal SEL output by the row driver 40.

The reset transistor RX is connected to the power supply voltage VDD and resets the floating diffusion node FD according to a reset control signal RS output by the row driver 40.

Other embodiments of unit pixels P are illustrated in FIGS. 5 through 8.

Figure 5:
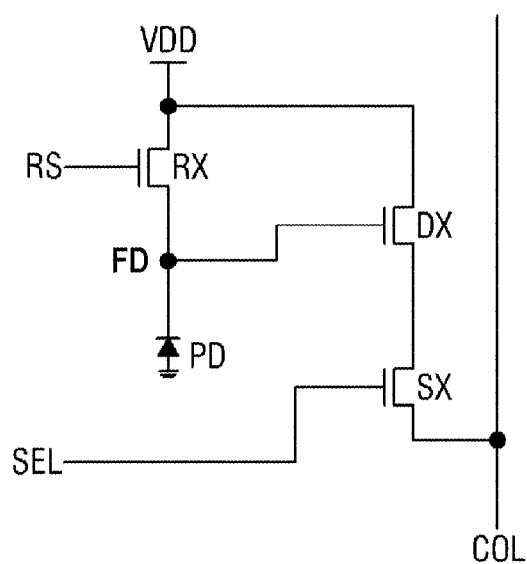

A unit pixel P illustrated in FIG. 5 is a three-transistor (3T) unit pixel and includes a photodiode PD, a floating diffusion node FD, a reset transistor RX connected to power supply voltage VDD and responsive to a reset control signal RS, a drive transistor DX, and a select transistor SX responsive to a select signal SEL. Photocharge generated by the photodiode PD is accumulated in the floating diffusion node FD, and a pixel signal is output to a column line COL in accordance with the operations of the drive transistor DX and the select transistor SX.

Figure 6:
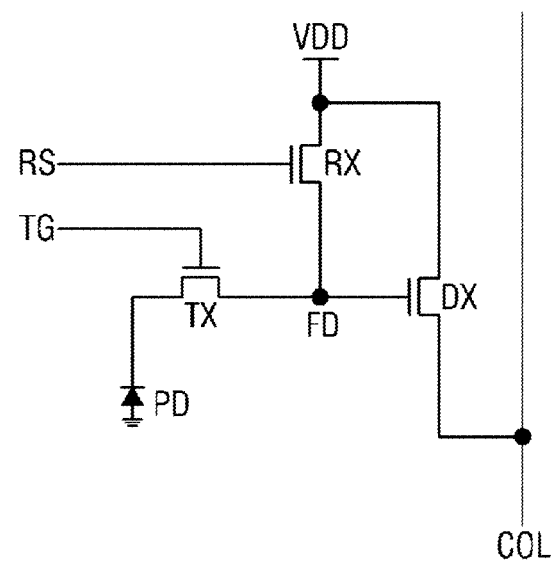

A unit pixel P illustrated in FIG. 6 is a three-transistor (3T) unit pixel and includes a photodiode PD, a transfer transistor TX responsive to a transfer control signal TG, a floating diffusion node FD, a reset transistor RX connected to power supply voltage VDD and responsive to a reset control signal RS, and a drive transistor DX. The reset transistor RX may be provided as an n-channel depression-type transistor. The reset transistor RX perform a similar function to that of the select transistor SX by resetting the floating diffusion node FD to the power supply voltage VDD according to the reset control signal RS output by the row driver 40 and setting the floating diffusion node FD to a low level of, for example, 0V. A pixel signal is output to a column line COL in accordance with the operation of the drive transistor DX.

Figure 7:
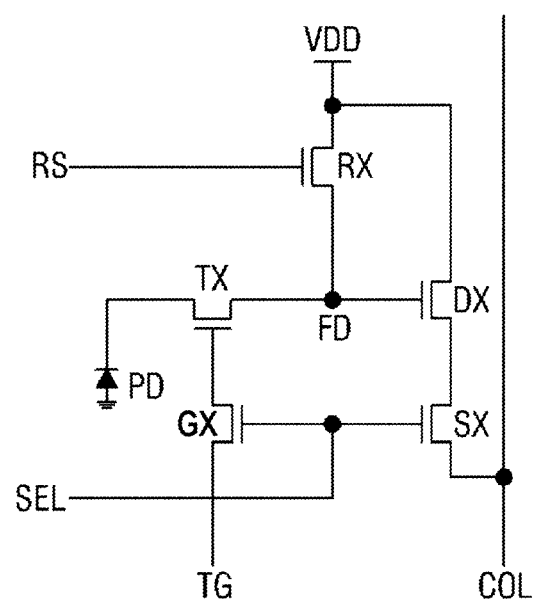

A unit pixel P illustrated in FIG. 7 is a five-transistor (5T) unit pixel and includes a photodiode PD, a transfer transistor TX responsive to a transfer control signal TG, a floating diffusion node FD, a reset transistor RX connected to power supply voltage VDD and responsive to a reset control signal RS, a drive transistor DX, a select transistor SX responsive to a select signal SEL, and another transistor GX that provides the transfer control signal TG to the transfer transistor TX responsive to the select signal SEL. A pixel signal is output to a column line COL in accordance with the operations of the drive transistor DX and the select transistor SX.

Figure 8:
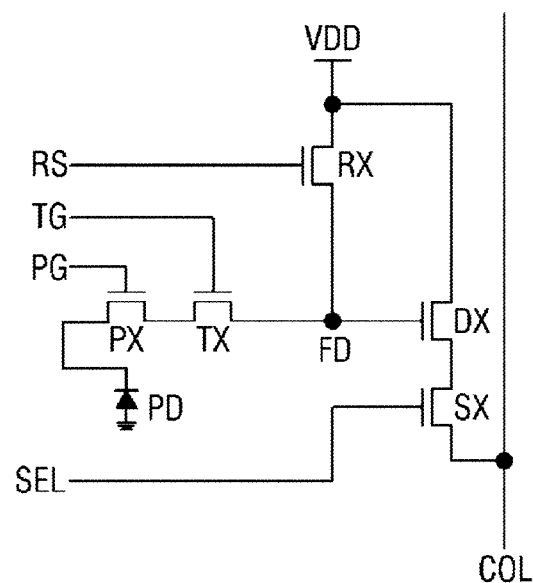

A unit pixel P illustrated in FIG. 8 is a 5T unit pixel and includes a photodiode PD, a transfer transistor TX responsive to a transfer control signal TG, a floating diffusion node FD, a reset transistor RX connected to power supply voltage VDD and responsive to a reset control signal RS, a drive transistor DX, a select transistor SX responsive to a select signal SEL, and another transistor PX responsive to a pixel select control signal PG to transfer photocharge generated by the photodiode PD to the transfer transistor TX. A pixel signal is output to a column line COL in accordance with the operations of the drive transistor DX and the select transistor SX.

Figure 9:
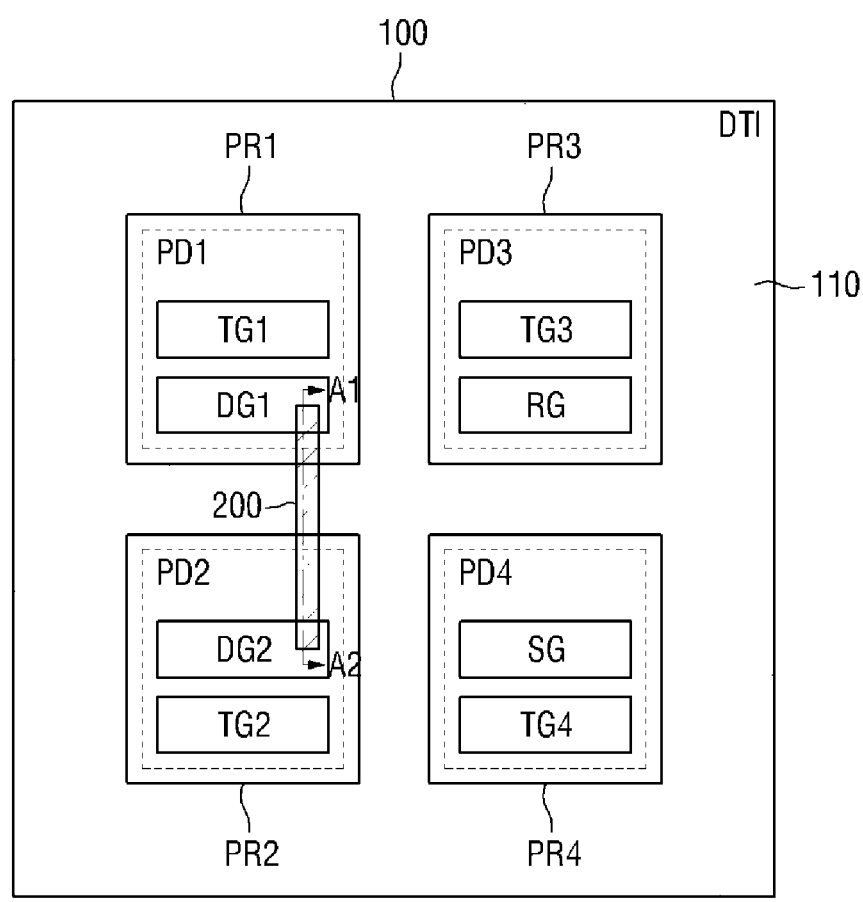
FIG. 9 illustrates a block diagram illustrating the layout of a sensor array according to an embodiment of the inventive concepts.
Figure 10:
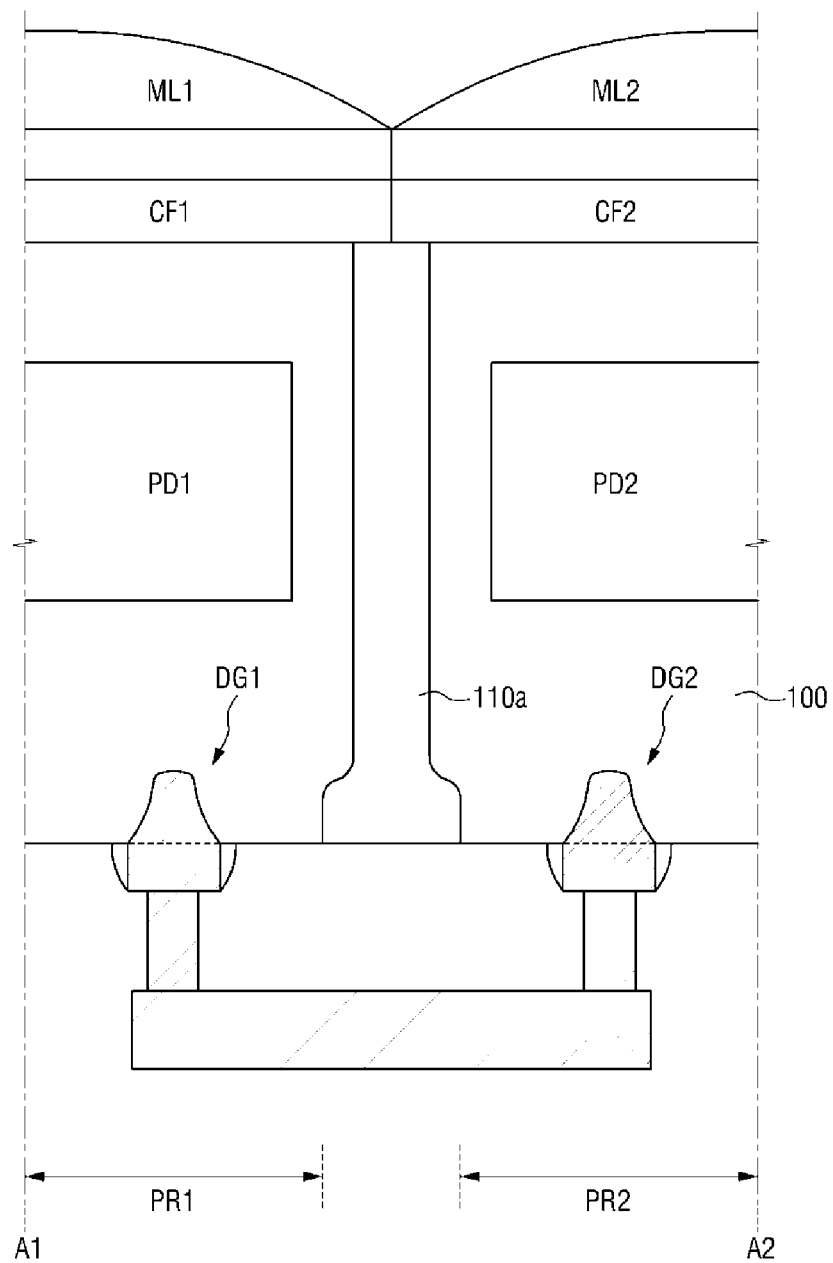
FIG. 10 illustrates an example cross-sectional view taken along line A1-A2 of FIG. 9.
Figure 11:
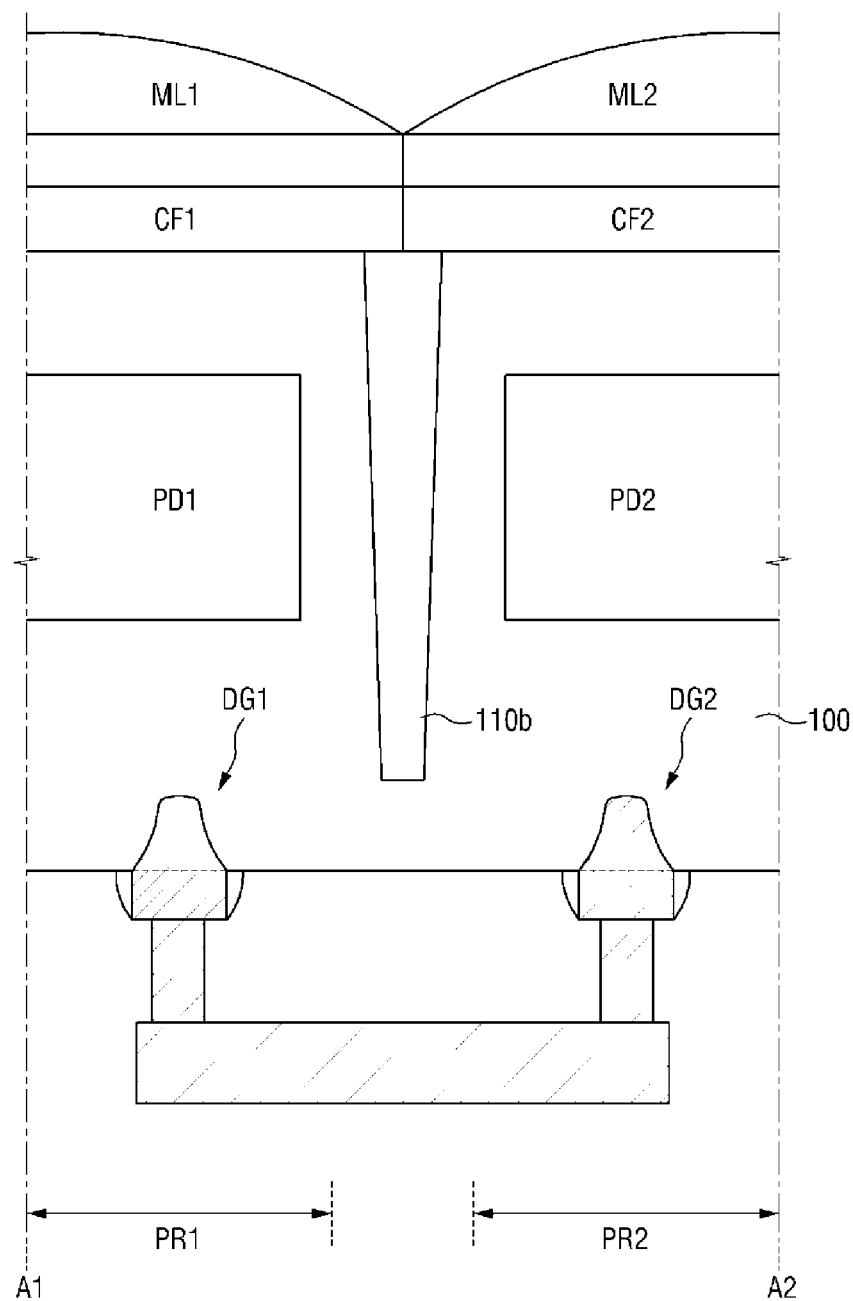
FIG. 11 illustrates another example cross-sectional view taken along line A1-A2 of FIG. 9.
Figure 12:
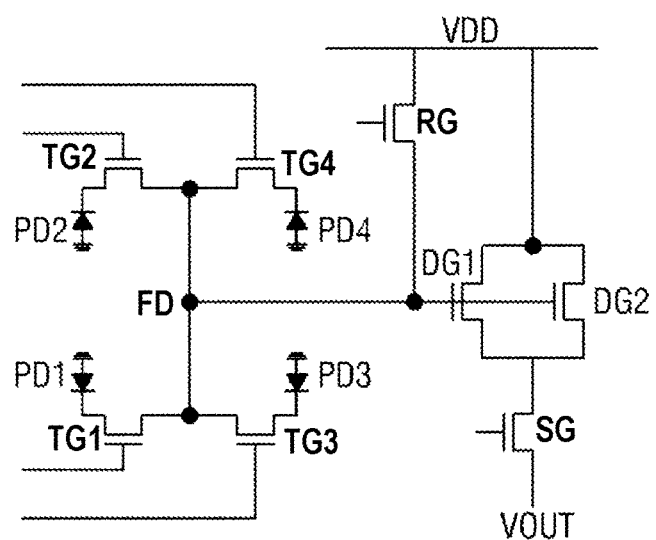
FIG. 12 illustrates a circuit diagram of a sensor array according to an embodiment of the inventive concepts.

FIG. 9 illustrates a block diagram of the layout of a sensor array according to an embodiment of the inventive concept. FIG. 10 illustrates an example cross-sectional view taken along line A1-A2 of FIG. 9. FIG. 11 illustrates another example cross-sectional view taken along line A1-A2 of FIG. 9. FIG. 12 illustrates a circuit diagram of a sensor array according to an embodiment of the inventive concept.

Referring to FIGS. 9 through 12, a sensor array according to an embodiment of the inventive concept includes a substrate 100, a device isolation layer 110, a first photoelectric conversion layer PD1, a second photoelectric conversion layer PD2, a third photoelectric conversion layer PD3, a fourth photoelectric conversion layer PD4, a first transfer transistor TG1, a second transfer transistor TG2, a third transfer transistor TG3, a fourth transfer transistor TG4, a first sub-transistor DG1, a second sub-transistor DG2, a reset transistor RG, a select transistor SG, and a wiring structure 200.

First through fourth pixel regions PR1 through PR4 are defined on the substrate 100. The first through fourth pixel regions PR1 through PR4 are disposed adjacent to one another, and are isolated from one another by the device isolation layer 110. That is, the device isolation layer 110 is formed among the first through fourth pixel regions PR1 through PR4, which are adjacent to one another.

A substrate of a first conductivity type (for example, a p type) may be used as the substrate 100. The substrate 100 may be a silicon-on-insulator (SOI) substrate including a lower silicon substrate, a buried insulating layer formed on the lower silicon substrate, and a silicon semiconductor layer formed on the buried insulating layer. The device isolation layer 110 is formed in the substrate 100, and due to the presence of the device isolation layer 110, active regions are defined.

The device isolation layer 110 has a deep trench isolation (DTI) structure. Due to the DTI structure, an interference phenomenon between adjacent pixels may be reduced. The first pixel region PR1 and the second pixel region PR2 are physically isolated from each other by the device isolation layer 110. In a case in which the device isolation layer 110 is formed to have the DTI structure, an electrical crosstalk phenomenon and an optical crosstalk phenomenon between adjacent pixels may be prevented.

The first photoelectric conversion layer PD1 is formed in the first pixel region PR1. The first photoelectric conversion layer PD1 may be, for example, a phototransistor, a photogate, a photodiode, a pinned photodiode, or a combination thereof, but is not limited thereto. In the following description, it is assumed that the first photoelectric conversion layer PD1 is a photodiode. The first photoelectric conversion layer PD1 may include an impurity region of a second conductivity type (for example, an n type). The impurity region of the second conductivity type (for example, an n type) may form a PN junction by being placed in contact with the first substrate 100, which is of the first conductivity type (for example, a p type), and may thus form a photodiode. The first photoelectric conversion layer PD1 may further include an impurity region of the first conductivity type (for example, a p type), which is placed in contact with the impurity region of the second conductivity type. The impurity region of the first conductivity type (for example, a p type) may be doped with a higher concentration of p-type impurities than the substrate 100, which is of the first conductivity (for example, a p type).

The second photoelectric conversion layer PD2 is formed in the second pixel region PR2, the third photoelectric conversion layer PD3 is formed in the third pixel region PR3, and the fourth photoelectric conversion layer PD4 is formed in the fourth pixel region PR4. The second photoelectric conversion layer PD2, the third photoelectric conversion layer PD3, and the fourth photoelectric conversion layer PD4 are substantially the same as described above with regard to the first photoelectric conversion layer PD1.

The device isolation layer 110 isolates the first through fourth photoelectric conversion layers PD1 through PD4 from one another. Accordingly, the first through fourth photoelectric conversion layers PD1 through PD4 do not interfere with one another.

The first transfer transistor TG1 is formed in the first pixel region PR1, the second transfer transistor TG2 is formed in the second pixel region PR2, the third transfer transistor TG3 is formed in the third pixel region PR3, and the fourth transfer transistor TG4 is formed in the fourth pixel region PR4.

Referring to FIG. 10, a sensor array according to an embodiment of the inventive concept may have a front-DTI (F-DTI) structure in which a device isolation layer 110*a* physically isolates a first pixel region PR1 and a second pixel region PR2 from each other. That is, device isolation layer 110*a* may be for example SiO, and device isolation layer 110*a* extends from the top surface of substrate 100 toward the bottom surface of substrate 100 to provide physical isolation between the photoelectric conversion layers PD. In the case of FIG. 10, the device isolation layer 110*a* is in contact with the top surface of the substrate 100 and bottom surface of substrate 100.

Referring to FIG. 11, a sensor array according to an embodiment of the inventive concept may have a back-DTI (B-DTI) structure in which a device isolation layer 110*b* optically isolates a first pixel region PR1 and a second pixel region PR2 from each other. That is, device isolation layer 110*b* may for example be SiO, and device isolation layer 110*b* extends from the top surface of substrate 100 toward a bottom surface of substrate 100. In the case of FIG. 11, the device isolation layer 110*b* is in contact with the top surface of the substrate 100, and is not in contact with the bottom surface of substrate 100. Device isolation layer 110*b* extends to a depth within substrate 100 past the photoelectric conversion layers PD, without extending to the bottom surface of substrate 100, to provide optical isolation between the photoelectric conversion layers PD.

Referring to FIGS. 10 and 11, a microlens ML1 and a color filter CF1 are disposed above substrate 100 at first pixel region PR1, and a microlens ML2 and a color filter CF2 are disposed above substrate 100 at second pixel region PR2. A lens buffer or a planarization layer may be formed between microlens ML1 and a color filter CF1, and between microlens ML2 and a color filter CF2.

Referring to FIG. 12, drain nodes of the first transfer transistor TG1, the second transfer transistor TG2, the third transfer transistor TG3, and the fourth transfer transistor TG4 are connected to a floating diffusion node FD. The source nodes of the first through fourth transfer transistors TG1, TG2, TG3 and TG4 are respectively connected to first through fourth photoelectric conversion layers PD1 through PD4. Gate electrodes of the first and second sub-transistor DG1 and DG2 are connected to the drain nodes of the first through fourth transfer transistors TG1, TG2, TG3 and TG4 via the floating diffusion node FD. The reset transistor RG is connected to the gate electrodes of the first and second sub-transistor DG1 and DG2. The select transistor SG is connected to source node of the first and second sub-transistor DG1 and DG2.

The floating diffusion node FD is a node in which photocharge generated by first through fourth photoelectric conversion layers PD1 through PD4 and transmitted via the first through fourth transfer transistors TG1 through TG4 is accumulated.

Referring again to FIG. 9, the first sub-transistor DG1 is formed in the first pixel region PR1, and the second sub-transistor DG2 is formed in the second pixel region PR2. The first sub-transistor DG1 and the second sub-transistor DG2 are electrically connected by the wiring structure 200. The first sub-transistor DG1 and the second sub-transistor DG2 in FIGS. 10 and 11 may be for example vertical-type transistors such as the transistor described with reference to FIG. 17, but are not limited thereto.

For example, the wiring structure 200 may include a metal line and may electrically connect the gate electrode of the first sub-transistor DG1 and the gate electrode of the second sub-transistor DG2. However, the shape of the wiring structure 200 may vary according to design modification made by a designer. The wiring structure 200 has a structure for electrically connecting the first sub-transistor DG1 and the second sub-transistor DG2.

For example, the first sub-transistor DG1 and the second sub-transistor DG2 may be source follower transistors. The first and second sub-transistors DG1 and DG2 may correspond to drive transistors such as drive transistor DX shown in FIG. 4 for example. According to an embodiment of the inventive concept as described with respect to FIG. 9, the area of the first through fourth pixel regions PR1 through PR4 is limited by the device isolation layer 110. The noise property of a source follower transistor used as a drive transistor may be improved by increasing the area of the source follower transistor. Source follower transistors affect pixel noise, and the more severe the noise, the worse the quality of an image. If the area of a source follower transistor is increased, pixel noise properties may be improved. However, the area of the first through fourth pixel regions PR1 through PR4 is limited as noted above. According to the present embodiment, in order to improve pixel noise properties, source follower transistor area is increased by forming respective source follower transistors (i.e., first and second sub-transistors DG1 and DG2) in both the first pixel region PR1 and the second pixel region PR2 which are adjacent to each other. The source follower transistors (i.e., first and second sub-transistors DG1 and DG2) are connected to each other by the wiring structure 200.

Referring to FIG. 9, the first sub-transistor DG1 and the second sub-transistor DG2 are source follower transistors, and since the area of the source follower transistors increases two times in contrast to an implementation including a single source follower transistor, pixel noise may be decreased by about ½.

The reset transistor RG is formed in the third pixel region PR3, and the select transistor SG is formed in the fourth pixel region PR4.

However, embodiments of the inventive concept are not limited to the aforementioned arrangement, and the arrangement of the first sub-transistor DG1, the second sub-transistor DG2, the reset transistor RG, and the select transistor SG may vary depending on design of the sensor array.

Figure 13:
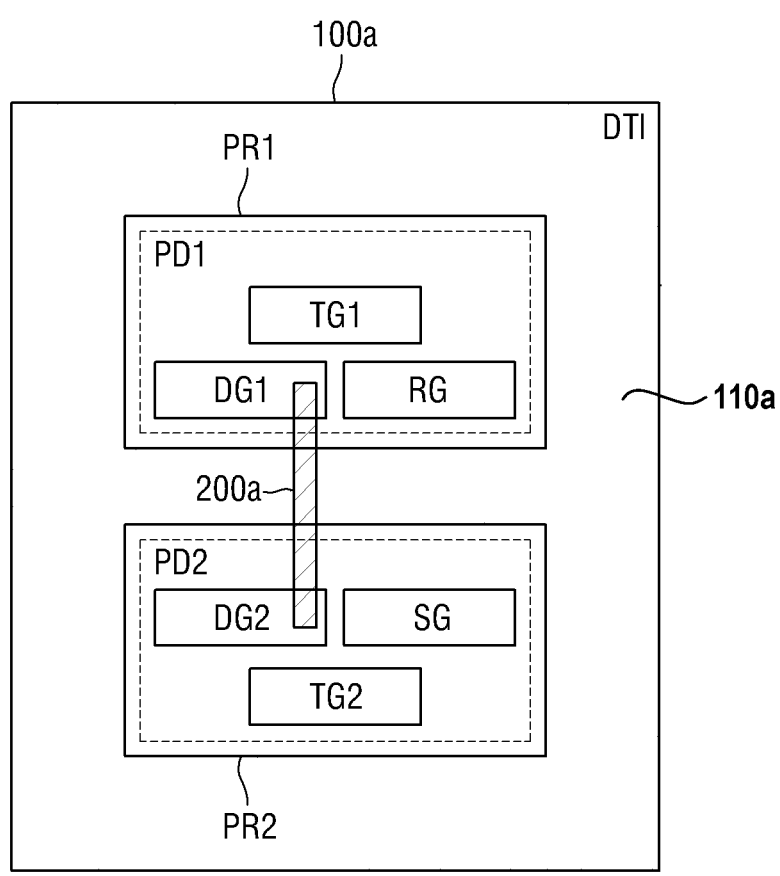
FIG. 13 illustrates a block diagram of the layout of a sensor array according to an embodiment of the inventive concepts.
Figure 14:
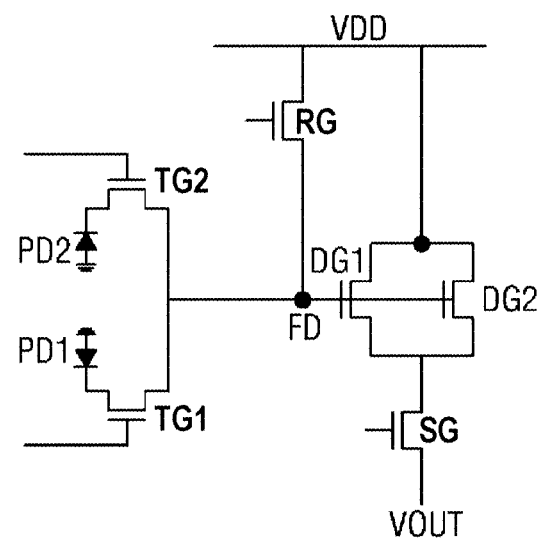
FIG. 14 illustrates a circuit diagram of the sensor array of FIG. 13.

FIG. 13 illustrates a block diagram of the layout of a sensor array according to an embodiment of the inventive concept. FIG. 14 illustrates a circuit diagram of the sensor array of FIG. 13.

Referring to FIGS. 13 and 14, a sensor array according to an embodiment of the inventive concept includes a substrate 100a, a device isolation layer 110a, a first photoelectric conversion layer PD1, a second photoelectric conversion layer PD2, a first transfer transistor TG1, a second transfer transistor TG2, a first sub-transistor DG1, a second sub-transistor DG2, a reset transistor RG, a select transistor SG, and a wiring structure 200a.

The first pixel region PR1 and the second pixel region PR2 are defined on the substrate 100a. The first pixel region PR1 and the second pixel region PR2 are disposed adjacent to each other, and are isolated from each other by the device isolation layer 110a. That is, the device isolation layer 110a is formed between the first and second pixel regions PR1 and PR2.

The device isolation layer 110a has a DTI structure. Due to the DTI structure, an interference phenomenon between adjacent pixels may be reduced. The first pixel region PR1 and the second pixel region PR2 are physically isolated from each other by the device isolation layer 110a.

The first photoelectric conversion layer PD1 is formed in the first pixel region PR1. The first photoelectric conversion layer PD1 may be, for example, a phototransistor, a photogate, a photodiode, a pinned photodiode, or a combination thereof, but is not limited thereto. In the following description, it is assumed that the first photoelectric conversion layer PD1 is a photodiode.

The second photoelectric conversion layer PD2 is formed in the second pixel region PR2. The second photoelectric conversion layer PD2 may be, for example, a phototransistor, a photogate, a photodiode, a pinned photodiode, or a combination thereof, but is not limited thereto. In the following description, it is assumed that the second photoelectric conversion layer PD2 is a photodiode.

The device isolation layer 110a isolates the first photoelectric conversion layer PD1 and the second photoelectric conversion layer PD2 from each other. Accordingly, the first photoelectric conversion layer PD1 and the second photoelectric conversion layer PD2 do not interfere with each other.

The first transfer transistor TG1 is formed in the first pixel region PR1, and the second transfer transistor TG2 is formed in the second pixel region PR2. Referring to FIG. 14, the drain node of the first transfer transistor TG1 and the drain node of the second transfer transistor TG2 are connected to a floating diffusion node FD.

The floating diffusion node FD is a node in which photocharge generated by the first and second photoelectric conversion layers PD1 and PD2 and transmitted via the first and second transfer transistors TG1 and TG2 is accumulated.

Referring again to FIG. 13, the first sub-transistor DG1 is formed in the first pixel region PR1, and the second sub-transistor DG2 is formed in the second pixel region PR2. The first sub-transistor DG1 and the second sub-transistor DG2 are electrically connected by the wiring structure 200a.

For example, the wiring structure 200a may include a metal line and may electrically connect the gate electrode of the first sub-transistor DG1 and the gate electrode of the second sub-transistor DG2. However, the shape of the wiring structure 200a may vary according to design modification made by a designer, and the wiring structure 200a has a structure for electrically connecting the first sub-transistor DG1 and the second sub-transistor DG2.

For example, the first sub-transistor DG1 and the second sub-transistor DG2 may be source follower transistors. The first and second sub-transistors DG1 and DG2 may correspond to drive transistors such as drive transistor DX shown in FIG. 4 for example The reset transistor RG is formed in the first pixel region PR1, and the select transistor SG is formed in the second pixel region PR2. However, the present embodiment is not limited to this arrangement, and the arrangement of the first sub-transistor DG1, the second sub-transistor DG2, the reset transistor RG, and the select transistor SG may vary depending on the design of the sensor array.

Figure 15:
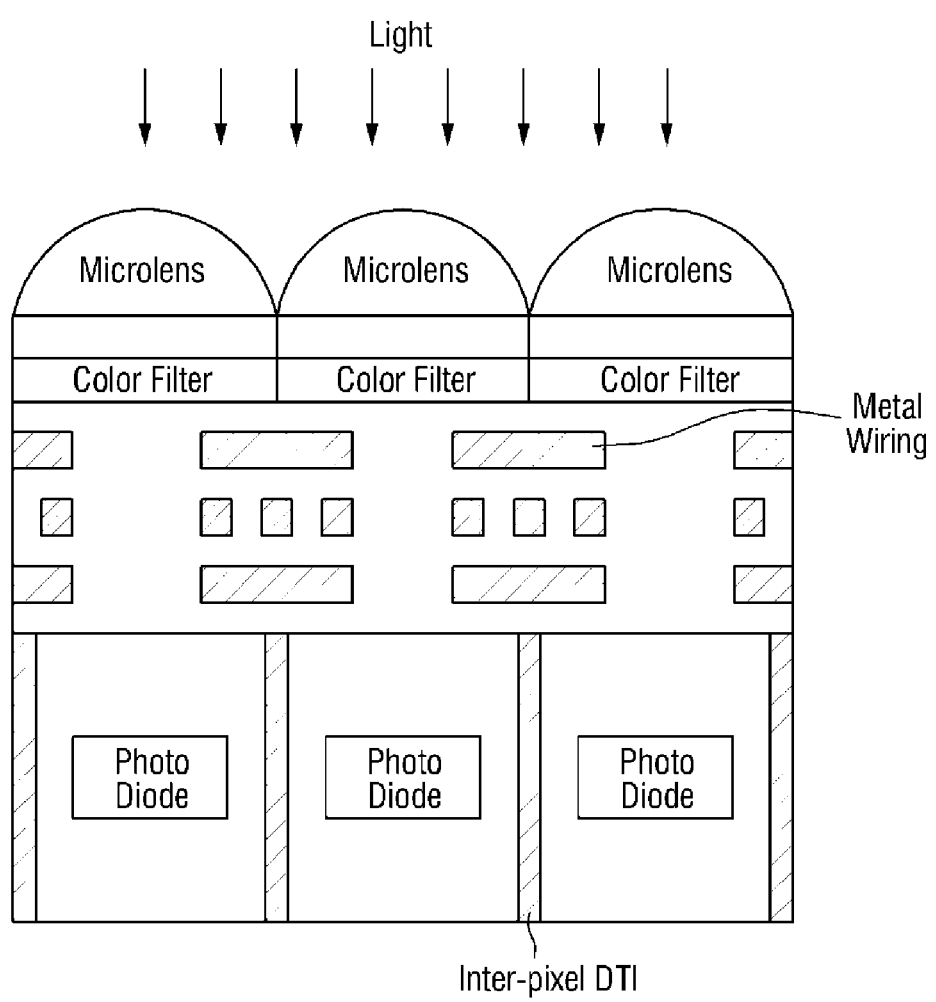
FIG. 15 illustrates a cross-sectional view of a front side illuminated (FSI) image sensor according to an embodiment of the inventive concepts.
Figure 16:
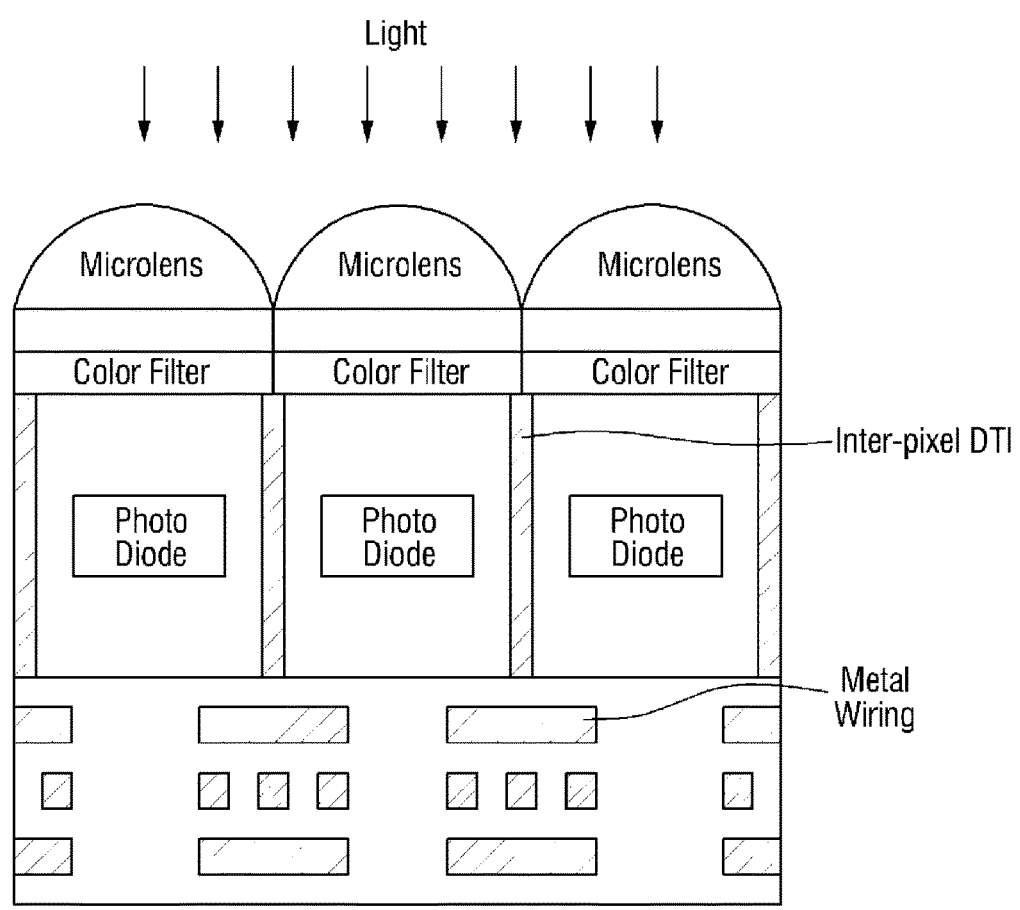
FIG. 16 illustrates a cross-sectional view of a back side illuminated (BSI) image sensor according to an embodiment of the inventive concepts.

FIG. 15 illustrates a cross-sectional view of a front side illuminated (FSI) image sensor according to an embodiment of the inventive concept. FIG. 16 illustrates a cross-sectional view of a back side illuminated (BSI) image sensor according to an embodiment of the inventive concept.

More specifically, FIG. 15 illustrates an FSI image sensor in which a microlens and a color filter are disposed on each of three pixels. Each of the pixels may be one of a red (R) pixel, a green (G) pixel, and a blue (B) pixel.

Photodiodes may be formed in a silicon substrate and are isolated from one another by a DTI structure. That is, an inter-pixel DTI is formed among the pixels.

Each of the pixels includes a circuit region, which is formed between a photodiode and a color filter. In the circuit region, metal wiring, multilayer wiring, and/or wiring layers may be formed. A lens buffer or a planarization layer may be formed between the microlens and the color filter of each of the pixels.

The aforementioned image sensor structure may be applicable to an FSI image sensor.

FIG. 16 illustrates a BSI image sensor in which a microlens and a color filter are disposed on each of three pixels. Each of the pixels may be one of an R pixel, a G pixel, and a B pixel.

The microlens and the color filter of each of the pixels are formed on a back side of a silicon substrate. Photodiodes are formed in the silicon substrate, and the pixels are isolated from one another by a DTI structure. That is, an inter-pixel DTI is formed among the pixels.

A circuit region is provided on a front side of the silicon substrate. In the circuit region, metal wiring, multilayer wiring, and/or wiring layers may be formed.

A lens buffer or a planarization layer may be formed between the microlens and the color filter of each of the pixels.

The aforementioned image sensor structure may be applicable to a BSI image sensor.

Figure 17:
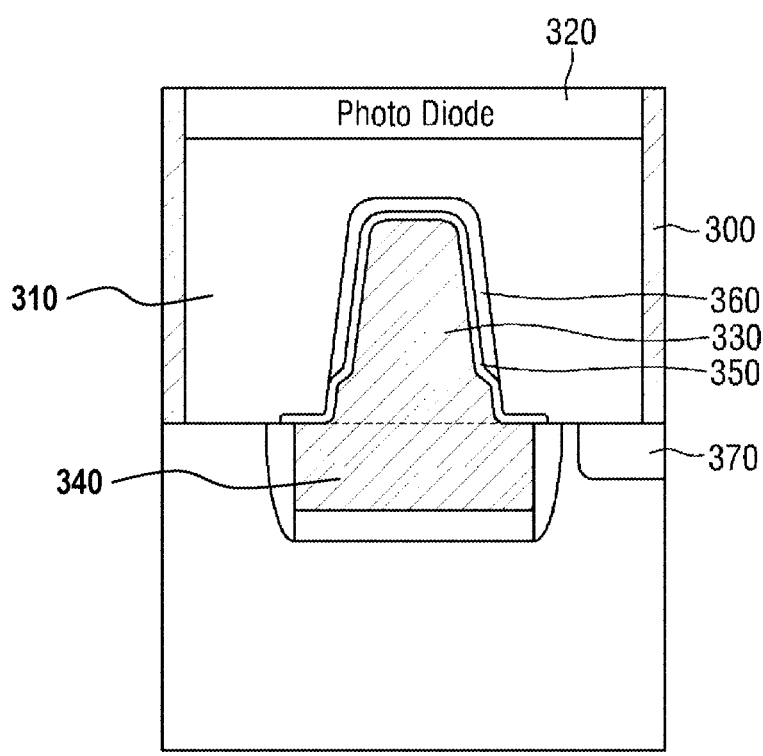
FIG. 17 illustrates a cross-sectional view of a vertical-type transmitting transistor included in an image sensor according to an embodiment of the inventive concepts.

FIG. 17 illustrates a cross-sectional view of a vertical-type transmitting transistor included in an image sensor according to an embodiment of the inventive concept.

Referring to FIG. 17, an image sensor includes a vertical-type transfer transistor. In a case in which the vertical-type transfer transistor is applied to an image sensor, a photodetection device may be isolated, and at the same time, large optical capacity may be maintained. Thus, photosensitivity properties may be improved.

A photoelectric conversion layer (photo diode) 320 is formed in a pixel isolated by a device isolation layer 300, and the vertical-type transfer transistor is disposed below the photoelectric conversion layer 320. The device isolation layer 300 has a DTI structure.

The photoelectric conversion layer 320 absorbs incident light and accumulates charge corresponding to the intensity of the incident light. The photoelectric conversion layer 320 may be a photodiode, a phototransistor, a photogate, a pinned photodiode, or a combination thereof, but is not limited thereto. FIG. 17 illustrates a photodiode as an example of the photoelectric conversion layer 320.

The vertical-type transfer transistor includes a lower gate 330, an upper gate 340, a gate insulating layer 350, and a channel impurity region 360.

The lower gate 330 is formed by filling a recess in a substrate 310. The recess may have inclined sidewalls. The slope of the inclined sidewalls of the recess may be, for example, 82 degrees to 88 degrees, but is not limited thereto. The edges formed by the sidewalls and the bottom of the recess may have a curved shape. The top of the recess may also have a curved shape. Due to the curved shape at the top and the bottom, respectively, of the recess, deterioration of the gate insulating layer 350 that may occur due to an electric field being concentrated on sharp edges may be prevented. Accordingly, the reliability of an image sensor may be improved. The gate insulating layer 350 is formed between the lower gate 330 and the substrate 310.

The channel impurity region 360 is formed in part of the substrate 310 adjacent to the recess in which the lower gate 330 is formed. The channel impurity region 360 is formed to surround the lower gate 330. Due to the presence of the channel impurity region 360, the threshold voltage of the vertical-type transfer transistor can be controlled. The channel impurity region 360 may be doped with a higher concentration of impurities than the substrate 310.

The upper gate 340 is formed on the lower gate 330 to be placed in contact with the top surface of the substrate 310. The upper gate 340 may have a different width from the lower gate 330. The bottom surface of the upper gate 340 may be larger than the top surface of the lower gate 330.

A floating diffusion region 370 may be formed in the active region on the substrate 310 to be separate from the photoelectric conversion layer 320. The floating diffusion region 370 may be doped with impurities of a different conductivity type from the substrate 310.

The vertical-type transfer transistor may be applicable to each of the first through fourth transfer transistors TG1 through TG4 that have been described above. The lower gate 330 and the upper gate 340 may collectively be characterized as a transfer gate electrode, and more particularly may also be characterized as a vertical gate electrode.

Figure 18:
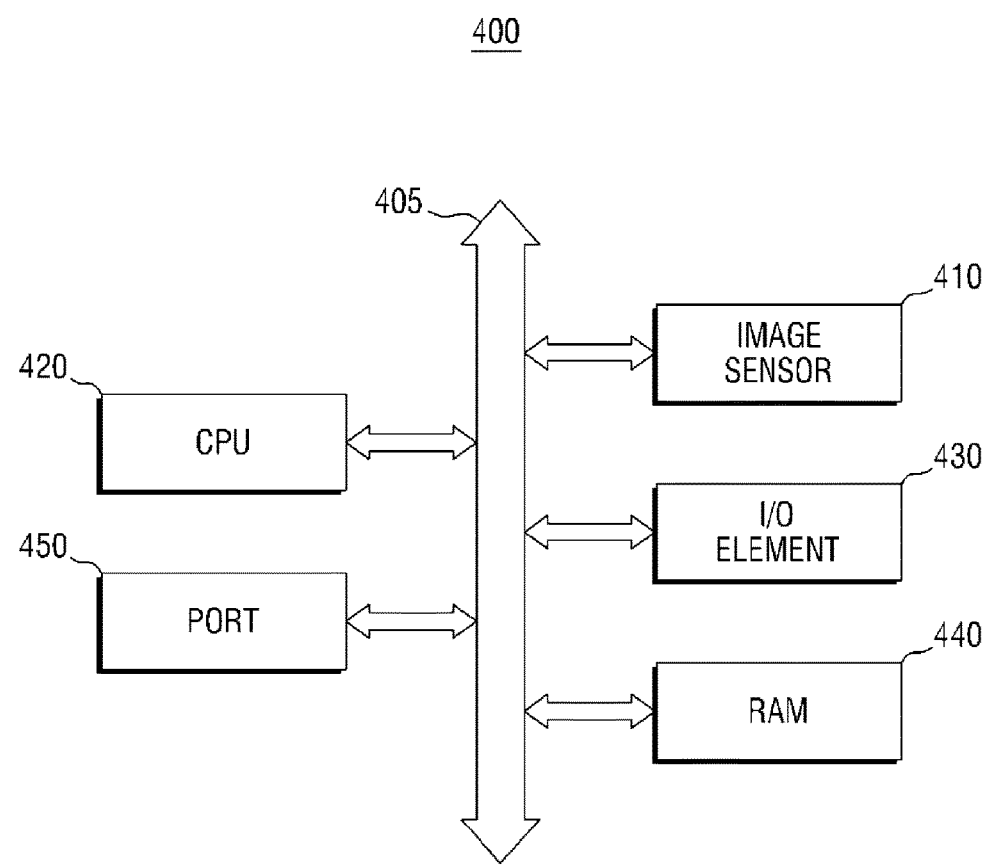
FIG. 18 illustrates a schematic view of a computer device.
Figure 19:
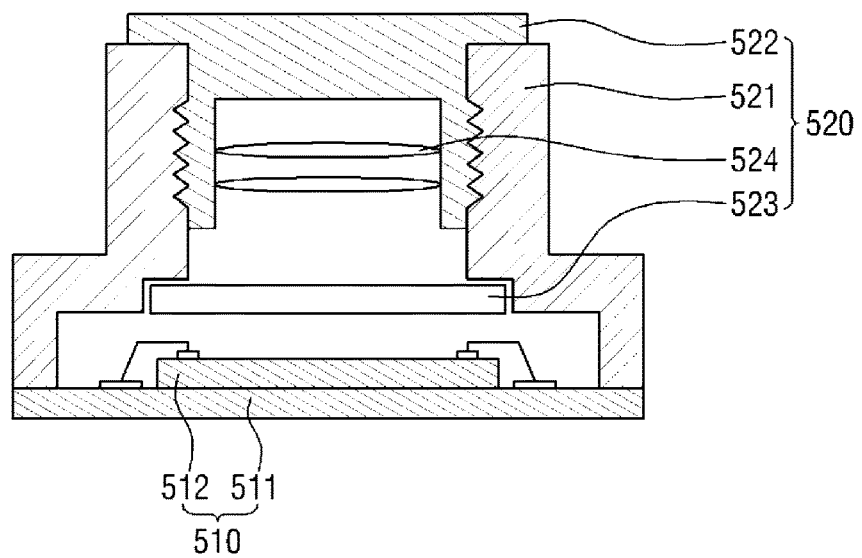
FIGS. 19 and 20 illustrate schematic views of camera devices.
Figure 20:
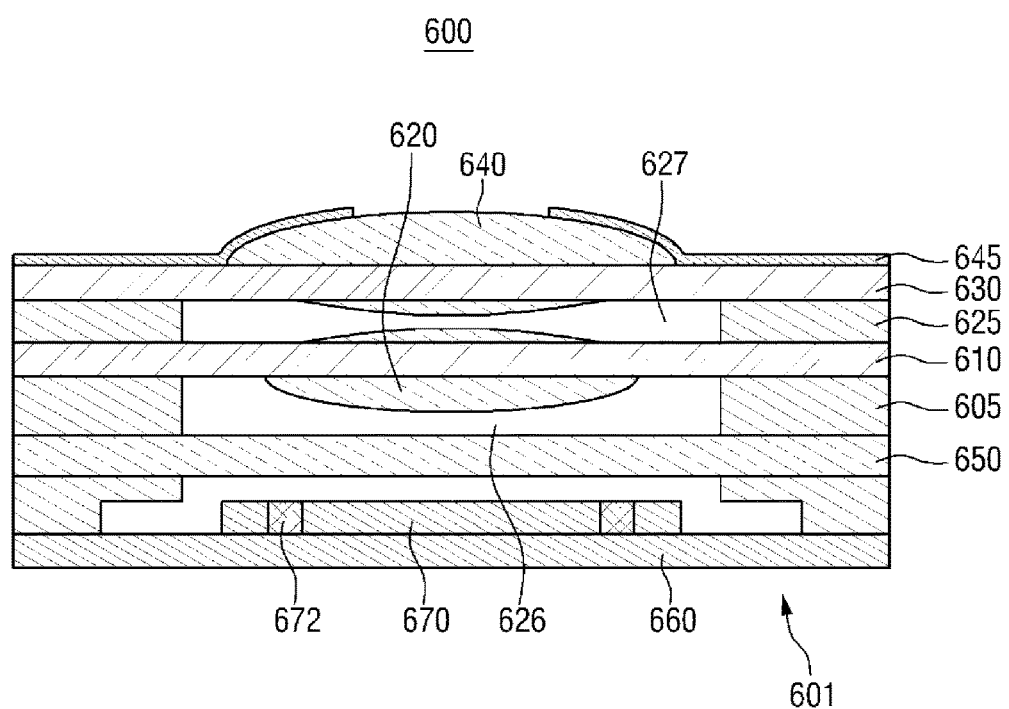
Figure 21:
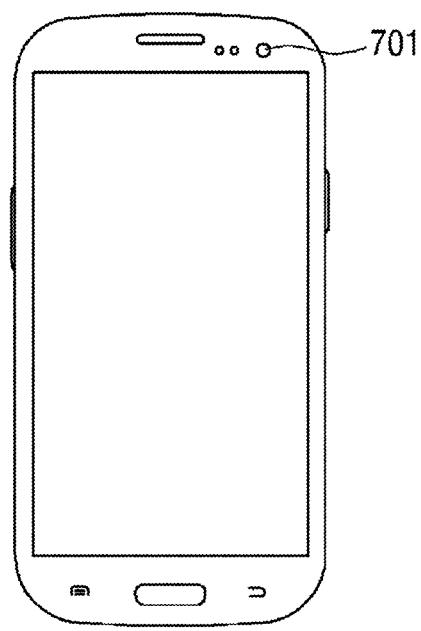
FIG. 21 illustrates a schematic view of a mobile phone device.

Examples of a processor-based device comprising an image sensor according to some example embodiments of the inventive concept will hereinafter be described with reference to FIGS. 18 through 21. FIG. 18 illustrates a computer device. FIGS. 19 and 20 illustrate camera devices. FIG. 21 illustrates a mobile phone device.

Referring to FIG. 18, a computer device 400 includes a central processing unit (CPU) 420 such as a microprocessor, which may communicate with an input/output (I/O) device 430 via a bus 405.

An image sensor 410 may communicate with other elements via the bus 405 or another communication link. The computer device 400 may further include a random access memory (RAM) 440 and/or a port 450 which may communicate with the CPU 420 via the bus 405.

The port 450 may be a port for coupling a video card, a sound card, a memory card, or a universal serial bus (USB) device for example to the computer device 400, or for exchanging data with another device. The image sensor 410 may be integrated together with the CPU 420, a digital signal processor (DSP) or a microprocessor. The image sensor 410 may also be integrated with a memory. The image sensor 410 may be integrated in a separate chip from a processor.

Referring to FIG. 19, a camera device 500 includes an image sensor package 510 in which an image sensor 512 is mounted on a circuit board 511 through wire bonding. A housing 520 is attached on the circuit board 511. The housing 520 protects the circuit board 511 and the image sensor 512 from an external environment.

A barrel 521 through which light from an image to be captured passes is formed at the housing 520. A protective cover 522 is installed at the outer end of the barrel 521 facing outward, and an infrared cut/anti-reflection filter 523 is mounted at the inner end of the barrel 521. A lens 524 is mounted in the barrel 521. The lens 524 may move along the thread of the barrel 521.

Referring to FIG. 20, a camera device 600 includes an image sensor package 601 having through vias 672. By using the through vias 672, an image sensor 670 and a circuit board 660 are electrically connected without the use of wire bonding.

The camera device 600 further includes a first lens 620, a second lens 640, and lens components 626 and 627. The camera device 600 further includes support members 605 and 625, an aperture 645, transparent substrates 610 and 630, and a glass member 650.

Referring to FIG. 21, an image sensor 701 is attached to a particular location on a mobile phone device 700. It should be understood that the image sensor 701 may be attached to various locations other than that illustrated in FIG. 21.

It should be understood that an image sensor according to embodiments of the inventive concept can be used in various devices, other than those set forth above, such as, for example, a scanner, a mechanized clock device, a navigation device, a video phone, a supervising device, an auto-focusing device, a tracking device, an operation monitoring device, an image stabilizing device, or the like.

While the inventive concept has been particularly shown and described with reference to embodiments herein, it should be understood that various changes in form and details may be made therein without departing from the spirit and scope of the inventive concept as defined by the following claims. It is therefore desired that the described embodiments be considered in all respects as illustrative and not restrictive, reference being made to the appended claims rather than the foregoing description to indicate the scope of the inventive concept.

What is claimed is:

1. An image sensor, comprising:
a substrate including a first pixel region and a second pixel region which is adjacent to the first pixel region;
a device isolation layer between the first pixel region and the second pixel region, and configured to isolate the first pixel region and the second pixel region from each other;
a first transistor disposed in the first pixel region;
a second transistor disposed in the second pixel region; and
a wiring structure configured to electrically connect the first transistor and the second transistor,
wherein the device isolation layer has a deep trench isolation (DTI) structure that extends from a top surface of the substrate toward a bottom surface of the substrate.

2. The image sensor of claim 1, wherein the wiring structure electrically connects a first gate of the first transistor and a second gate of the second transistor.

3. The image sensor of claim 2, wherein the first transistor and the second transistor are source follower transistors.

4. The image sensor of claim 3, wherein the first transistor and the second transistor are vertical-type transistors.

5. The image sensor of claim 1, wherein the device isolation layer is in contact with the top surface of the substrate and the bottom surface of the substrate.

6. The image sensor of claim 1, wherein the device isolation layer is in contact with the top surface of the substrate, and is not in contact with the bottom surface of the substrate.

7. The image sensor of claim 1, wherein the wiring structure is disposed on the top surface of the substrate, and
wherein the image sensor further comprises lenses and filters on the wiring structure.

8. The image sensor of claim 1, wherein the wiring structure is disposed on the top surface of the substrate, and
wherein the image sensor further comprises lenses and filters on the bottom surface of the substrate.

9. An image sensor, comprising:
a substrate including first through fourth pixel regions;
a device isolation layer between the first, second, third and fourth pixel regions, and configured to isolate the first through fourth pixel regions from each other;
a first drive transistor disposed in the first pixel region;
a second drive transistor disposed in the second pixel region;
a reset transistor disposed in the third pixel region;
a select transistor disposed in the fourth pixel region; and
a wiring structure configured to electrically connect the first drive transistor and the second drive transistor.

10. The image sensor of claim 9, wherein the device isolation layer comprises a DTI structure that extends from a top surface of the substrate toward a bottom surface of the substrate.

11. The image sensor of claim 10, wherein the device isolation layer is in contact with the top surface of the substrate and the bottom surface of the substrate.

12. The image sensor of claim 10, wherein the device isolation layer is in contact with the top surface of the substrate, and is not in contact with the bottom surface of the substrate.

13. The image sensor of claim 9, further comprising first, second, third and fourth transfer transistors, wherein
a first transfer gate electrode of the first transfer transistor is disposed in the first pixel region,
a second transfer gate electrode of the second transfer transistor is disposed in the second pixel region,
a third transfer gate electrode of the third transfer transistor is disposed in the third pixel region, and
a fourth transfer gate electrode of the fourth transfer transistor is disposed in the fourth pixel region.

14. The image sensor of claim 13, wherein the first through fourth transfer gate electrodes are vertical-type gate electrodes which extend from a surface of the substrate to inside the substrate.

15. The image sensor of claim 9, wherein the wiring structure extends along a direction in which the first drive transistor and the second drive transistor are separate from each other.

16. An image sensor, comprising:
first through fourth transfer transistors disposed in respective first through fourth pixel regions;
a first photoelectric conversion device connected to a source node of the first transfer transistor;
a second photoelectric conversion device connected to a source node of the second transfer transistor;
a third photoelectric conversion device connected to a source node of the third transfer transistor;
a fourth photoelectric conversion device connected to a source node of the fourth transfer transistor;
a first drive transistor disposed in the first pixel region and connected to a drain node of the first transfer transistor, a drain node of the second transfer transistor, a drain node of the third transfer transistor, and a drain node of the fourth transfer transistor;
a second drive transistor disposed in the second pixel region and connected to the drain node of the first transfer transistor, the drain node of the second transfer transistor, the drain node of the third transfer transistor, and the drain node of the fourth transfer transistor; and
a wiring structure configured to electrically connect a gate electrode of the first drive transistor and a gate electrode of the second drive transistor.

17. The image sensor of claim 16, wherein the first drive transistor and the second drive transistor are source follower transistors.

18. The image sensor of claim 16, further comprising:
a reset transistor connected to the gate electrode of the first drive transistor and the gate electrode of the second drive transistor.

19. The image sensor of claim 16, further comprising:
a select transistor connected to a source node of the first drive transistor and a source node of the second drive transistor.

20. The image sensor of claim 16, wherein the first through fourth transfer transistors are vertical type transistors.

* * * * *